PULSE GENERATOR FOR DEVELOPING PULSES OF PREDETERMINED WIDTH AND SHORT FALL TIME
Filed Dec. 15, 1959

Edward B. Frysinger,
INVENTOR.
BY.
Walter J. Adam
ATTORNEY.

United States Patent Office 3,161,830
Patented Dec. 15, 1964

3,161,830

PULSE GENERATOR FOR DEVELOPING PULSES OF PREDETERMINED WIDTH AND SHORT FALL TIME

Edward B. Frysinger, Manhattan Beach, Calif., assignor to Hughes Aircraft Company, Culver City, Calif., a corporation of Delaware Filed Dec. 15, 1959, Ser. No. 859,814
8 Claims. (Cl. 328—34)

Figure 1:
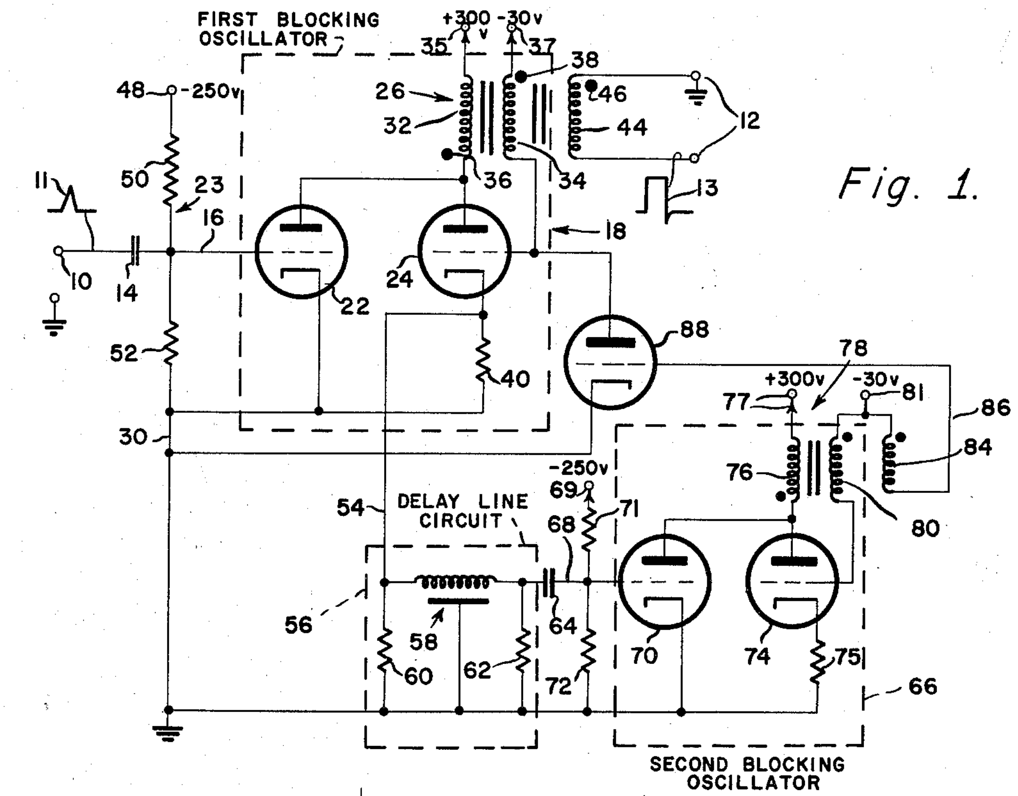

This invention relates to pulse generator circuits and particularly to a generator circuit that develops a pulse with a fast fall time and a selected pulse width.

In the prior art, pulses of a predetermined width are generally generated by a blocking oscillator circuit. However, the inductive elements and the stray capacitance in the blocking oscillator circuit provides a time constant that prevents the output pulse from having a steep trailing edge.

There are many circuits where it is required that a pulse with a steep leading and trailing edge and an accurate pulse width be generated. For example, in a transmitter for an air to air identification system, it is required for accuracy of the system that the pulse width be constant at varying voltage levels of the pulse, and that this be maintained over a wide range of pulse repetition frequency. The pulse is developed in response to an input trigger signal and is applied to a switching tube which in turn controls a magnetron for transmitting radio frequency energy into space. Because of the varying impedance of the switching tube, the pulse must have constant width at all voltage levels of the pulse, that is, the pulse must have a steep leading and trailing edge to maintain a transmitting pulse of energy with a constant width. This constant pulse width must be maintained over a wide range of frequency of the input trigger signal.

It is thus an object of this invention to provide a circuit that responds to a trigger pulse to develop a substantially square output pulse.

It is a further object of this invention to provide a pulse generator circuit that responds to a trigger pulse to develop output pulses having selected width.

It is a still further object of this invention to provide a pulse generating circuit that responds to a plurality of input trigger signals at a high repetition rate to develop output pulses that have steep leading and trailing edges and that have a constant width.

It is another object of this invention to provide a pulse generating circuit that develops pulses of constant width and that have an extremely short fall time.

Briefly, in accordance with this invention a pulse generating circuit is provided that includes a first blocking oscillator circuit having a triode that goes into regenerative blocking oscillator action in response to a trigger pulse to develop the leading edge of an output pulse. The pulse developed on the cathode of the triode is passed through a delay line to a triode of a second blocking oscillator which is biased into its blocking oscillator action in response to the leading edge of the delayed pulse. A pulse developed by the second blocking oscillator is applied to the grid of a control tube to bias it into conduction and to immediately couple the grid of the triode in the first blocking oscillator to ground potential. The blocking oscillator action of the first blocking oscillator is quickly terminated and the pulse developed by the first blocking oscillator rapidly falls with a slope equal to the leading edge. The width of the pulse is determined by the delay time of the delay line.

Figure 2:
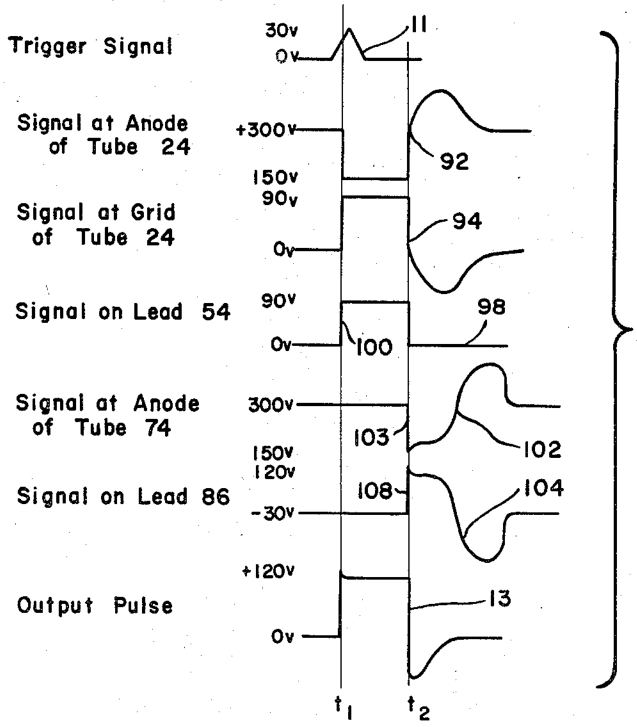

The novel feature of this invention, as well as the invention itself, both as to its organization and method of operation, will best be understood from the accompanying description taken in connection with the accompanying drawings, in which like reference characters refer to like parts, and in which:

FIG. 1 is a schematic circuit diagram of the pulse generator circuit in accordance with this invention; and FIG. 2 is a series of waveforms of voltage versus time at various points of the circuit of FIG. 1 for explaining the operation thereof.

Referring first to FIG. 1, the arrangement of the elements will be explained. The circuit includes input terminals 10 to which a trigger signal shown by a waveform 11 is applied and a pair of output terminals 12 at which an output pulse shown by a waveform 13 is developed. The input terminal 10 may be connected to a source of trigger signals at a high pulse repetition frequency. The trigger signal of the waveform 11 is applied through a coupling capacitor 14 and through a lead 16 to a first blocking oscillator circuit 18 that includes an amplifier tube 22, a blocking oscillator tube 24, which tubes may be triodes, and a transformer 26. The first blocking oscillator 18 is a conventional parallel triggering blocking oscillator. The amplifier tube 22 is responsive at its grid to the input trigger signal of the waveform 11 and is biased through a resistive bleeder network 23 in the grid circuit. The anode of the tube 22 applies a negative-going signal to one end of a winding 32 of the transformer 26 and to the anode of the tube 24, which negative-going signal is inverted and applied as a positive going signal through a mutually coupled winding 34 to the grid of the tube 24. The winding 32 has the end opposite to the anode of the tube 24 coupled to a +300 volt terminal 35 and the winding 34 has its end opposite to the grid of the tube 24 coupled to a —30 volt terminal 37. The transformer 26 is arranged so that dots 36 and 38 have the same polarity. The cathode of the tube 24 is coupled to ground through a resistor 40 and a lead 30. The output pulse of the waveform 13 is obtained from a winding 44 mutually coupled to the windings 32 and 34 and arranged with a polarity indicated by a dot 46. The lead 16 coupled to the grid of the amplifier tube 22 is biased by the bleeder network 23 including a resistor 50 connected to a —250 volt terminal 48 and a resistor 52 coupled through the lead 30 to ground.

A signal developed by the cathode follower action of the blocking oscillator tube 24, which signal is similar to the output signal of the waveform 13, is applied through a lead 54 to a delay line circuit 56. A conventional delay line 58 is provided in the delay line circuit 56 which is terminated at the lead 54 to ground through a resistor 60 and is terminated at the opposite end through a resistor 62. The resistors 60 and 62 have values to match the characteristic impedance of the delay line 58 so that no reflections are developed. The delayed signal, the leading edge of which is to be utilized as will be explained subsequently, but which may have an uneven and slow rise time because of the characteristics of the delay line 58, is applied through a coupling capacitor 64 to a second blocking oscillator 66 through a lead 68 for developing a pulse with a fast rise time. The coupling capacitor 64 and the resistor 72 have values so as to present a small time constant to signals passed therethrough. The lead 68 is biased from a —250 volt terminal 69 through a resistor 71 and through a resistor 72 to ground. The second blocking oscillator 66 is a conventional parallel triggering blocking oscillator similar to the first blocking oscillator 18. An amplifier tube 70 is responsive through its grid to the delayed signal on the lead 68 with its cathode directly coupled to ground. The anode of the tube 70 is arranged to apply a negative-going trigger signal to an anode of a blocking oscillator tube 74 and to one end of winding 76 of a transformer 78, the other end of which is coupled to a +300 volt terminal 77. The cathode of the tube 74 is coupled to ground through a resistor 75. The negative-going signal from the anode of the tube 74 is inverted and applied as a positive-going signal through a mutually coupled winding 80 of the transformer 78 to a grid of the tube 74. The end of the winding 80 opposite to the grid of the tube 74 is coupled to a −30 volt terminal 81. A resistor 75 couples a cathode of the tube 74 to ground. A mutually coupled winding 84 of the transformer 78 has one end coupled to the terminal 81 and applies the signal developed by the second blocking oscillator 66 to a lead 86. The polarities of the windings 76, 80 and 84 are indicated by dots to be similar to the windings of the first blocking oscillator 18.

The delayed signal developed by the second blocking oscillator 66 is applied through the lead 86 to the grid of a control tube 88 which has its cathode coupled directly to ground and its anode coupled to the grid of the blocking oscillator tube 24. As will be explained subsequently, the control tube 88 is biased into conduction in response to this delayed signal developed from the leading edge of the signal developed by the first blocking oscillator 18 so as to apply substantially ground potential to the grid of the tube 24 and rapidly terminate the regenerative action of the blocking oscillator tube. Thus, the output pulse of the waveform 13 has a trailing edge that falls as rapidly as its leading edge rises and that has a width determined by the delay time of the delay line 58.

Referring now to FIG. 2 which shows a graph of voltage versus time of waveforms showing a series of time correlated signals, as well as to FIG. 1, the operation of the pulse generator will be explained in further detail.

In the absence of the trigger pulse of the waveform 11, all tubes of the circuit are biased out of conduction, thus providing a saving of power. The potential on the lead 16 is maintained below the cut off level of the tube 22 as determined by the +300 volts applied to the anode from the +300 volt terminal 35. The tube 24 is held at cut off because the +300 volts from the terminal 35 is applied to the anode of the tube 24 and the −30 volts from the terminal 37 is applied to the grid of the tube 24. The tubes of the second blocking oscillator 66 are biased below cut off in a similar manner. The control tube 88 is also maintained biased below cut off by the −30 volts at both its anode and grid. When the trigger signal of the waveform 11 is applied to the grid of the amplifier tube 22 and rises to a required level at time $t_1$, the tube 22 is biased into conduction applying a negative-going pulse to the anode of the tube 24 as shown by a waveform 92. The leading edge of the negative-going pulse of the waveform 92 is applied through the windings 32 and 34 to the grid of the tube 24 as a positive pulse of a waveform 94.

To further describe this blocking oscillator action, as current starts to flow through the winding 32 a magnetic field is set up in the transformer 26 to induce a potential in the winding 34 such that the end coupled to the grid of the tube 24 is positive. This magnetic field builds up from zero to a maximum in direct proportion to the current passed through the anode of the amplifier tube 22 and therefore induces the voltage at the grid of the tube 24. As the tube 24 draws current through its anode, the magnetic field in the transformer 26 continues to build up until such time as the current through the anode of the tube 24 reaches its maximum value. Shortly after this time, the field starts to collapse. However, as utilized in this circuit, the field is not allowed to collapse as in normal blocking oscillator action for the tube 24 is rapidly biased out of conduction shortly before this can occur by the control tube 88, as will be explained subsequently.

Thus, in response to the leading edge at time $t_1$ of the pulse of the waveform 94 applied to the grid of the tube 24, a positive signal is formed on the cathode thereof and on the lead 54 as shown by a waveform 98. At time $t_1$, the waveform 98 has a leading edge or potential rise

100 that will be utilized for triggering blocking oscillator tube 74.

The waveform 98 is applied to the delay line circuit 56 where the leading edge 100 is delayed until time $t_2$ and applied to the grid of the amplifier tube 70. The leading edge 100, after passing through the delay line 58, may have an uneven shape and a poor rise time. Thus, the second blocking oscillator 66 is provided to develop a signal with a fast rise time. This positive voltage of the leading edge 100 after passing through the delay line 58 at time $t_2$ biases the tube 70 into conduction and starts the regenerative action of the blocking oscillator tube 74 and the transformer 78 similar to that discussed previously in relation to the first blocking oscillator 18. A negative-going signal as shown by waveform 102 having a steep leading edge 103 is developed at the anode of the tube 74 and a positive-going signal similar to waveform 104 is applied to the grid of the tube 74. As the tube 74 is rapidly biased into conduction by the regenerative action, the signal of the waveform 104 is applied to the lead 86. The waveform 104 has a leading edge 108 at time $t_2$ with a very fast rise time as is characteristic of blocking oscillators and with substantially no delay with respect to the signal on the lead 68. As is well known there is a minimum of delay in developing the leading edge of a pulse by a blocking oscillator. Thus, the time of occurrence of the leading edge 108 at time $t_2$ is determined primarily by the delay time of the delay line 58.

The leading edge 108 of the waveform 104 is applied through the lead 86 to the grid of the control tube 88 which normally is maintained nonconductive but which has an anode voltage of +150 volts when tube 24 is conducting. The leading edge 108 has a large positive voltage swing so that the control tube 88 is immediately rendered conductive and a potential substantially at ground is impressed on the grid of the blocking oscillator tube 24. Thus, a potential near ground is impressed across the winding 34 so that the terminals 12 are effectively established at ground potential to cause the trailing edge of the output pulse 13 to rapidly fall toward ground potential. Also, the blocking oscillator tube 24 is rapidly biased out of conduction. The output pulse of the waveform 13 falls below ground potential because of the stray capacitance found in the transformer 26, but this portion occurs after the useful pulse. Because the leading edge 108 is regenerated by blocking oscillator 74, any distortion of the signal introduced by the delay line 58 is in effect eliminated. Therefore, applying the leading edge 108 of the waveform 104 to the grid of the control tube 88 causes the trailing edge of the output pulse of the waveform 13 to have a similarly steep slope. Also, as discussed previously, the minimum amount of delay in the elements of the blocking oscillators 18 and 66 results in the width of the output pulse of the waveform 13 being substantially the time delay in the delay line 58. Therefore, by either changing or providing means to select various delay lines, an output pulse may be developed having an accurate pre-selected width.

When the leading edge 108 of the waveform 104 is applied to the grid of the control tube 88, the signal of the waveform 92 at the anode of the tube 24 rapidly rises at time $t_2$ from +150 volts to +300 volts and with a characteristic overshoot as determined by the resonant action of the inductor 26. Also, the signal of the waveform 94 at the grid of the tube 24 falls rapidly at time $t_2$ from 90 volts to ground potential and below with a characteristic overshoot. It is to be noted that the trigger signal of the waveform 11 may have a width extending beyond time $t_2$ provided it does not extend into the recovery time of the blocking oscillator tube 24. The signal of the anode of the tube 74, as shown by the waveform 102, rises from approximately 150 volts with the characteristic slow rate of rise of the trailing edge of a pulse developed by a blocking oscillator. The waveform 102 shows an overshoot above +300 volts before returning to the +300 volts steady state level. The waveform 104 also has a trailing edge that has a long fall time from approximately +120 volts to −30 volts as a characteristic of the output pulse of blocking oscillator circuits. The second blocking oscillator circuit 66 thus must be provided with time for its field to collapse to complete the formation of the pulse 104 and time for the negative overshoot below −30 volts of the waveform 104 to terminate before applying another trigger signal of the waveform 11. The output pulse may have voltage levels between ground and +120 volts. The first blocking oscillator 18 may be capable of developing a pulse having a .8 microsecond width for an output pulse of the waveform 13 of .6 microsecond width and the second blocking oscillator 66 may develop an output pulse of the waveform 104 having a .25 microsecond width, for example. Thus, the circuit of the invention may operate with pulse repetition frequencies of the trigger signal of the waveform 11 between 400 and 27,000 cycles per second, for example. The accuracy of the width of the output pulse of the waveform 13 in the circuit of the invention has been found to be less than five percent variation in width at the 50% voltage amplitude point of the pulse. The voltage in FIGS. 1 and 2 are representative of voltages that may be utilized and of voltage levels of the waveforms.

Thus, there has been described a pulse generator circuit that develops an output pulse having a width as determined by a delay line and having a very steep trailing edge. The leading edge of the pulse developed by the first blocking oscillator which characteristically has a steep slope is utilized after being delayed to trigger a second blocking oscillator to develop the trailing edge of the output pulse from the first blocking oscillator so that both the leading and trailing edges of the output pulse have substantially the same steep slope. This circuit is very useful, for example, in a transmitter for an air to air identification system where the circuit conditions require an accurate pulse width for controlling the magnetron at various voltage levels of the pulse.

What is claimed is:

1. A pulse generator circuit comprising a source of trigger signals, a first blocking oscillator coupled to said trigger source to develop a first and a second pulse, delay means coupled to said first blocking oscillator for delaying said first pulse, a second blocking oscillator coupled to said delay means for developing a signal in response to the delayed first pulse, and a control means coupled between said first and second blocking oscillators to control said first blocking oscillator in response to the signal developed by said second blocking oscillator and thereby terminate said second pulse.

2. A pulse generator circuit responsive to a trigger signal from an input source to develop an output pulse comprising a first blocking oscillator coupled to said input source and responsive to the trigger signal to develop a leading edge of the output pulse, delay means coupled to said first blocking oscillator for developing a delayed signal, a second blocking oscillator coupled to said delay means for developing a control pulse having a steep leading edge in response to said delayed signal, and gating means coupled between said first and second blocking oscillators for responding to said control pulse to control said first blocking oscillator to form a trailing edge of said output pulse.

3. A pulse generator comprising a source of input pulses, a first blocking oscillator coupled to said source of input pulses for responding to one of said input pulses to start the formation of a first pulse having a steep leading edge, a delay line circuit coupled to said first blocking oscillator circuit for responding to the leading edge of said first pulse to develop a delayed leading edge, a second blocking oscillator coupled to said delay line circuit for developing a second pulse having a steep leading edge in response to the delayed leading edge of said first pulse, gating means coupled to said first and second blocking oscillators for responding to the leading edge of said second pulse to control said first blocking oscillator to rapidly terminate said first pulse with a steep trailing edge.

4. A circuit for responding to a source of trigger signals to apply a pulse to an output terminal comprising a first blocking oscillator coupled to said source of trigger signals and to said output terminal, said first blocking oscillator responding to a trigger signal to develop a portion of first and second pulses having leading edges with a substantially fast rise time and apply said portion of said first pulse to said output terminal, a delay line coupled to said first blocking oscillator, said first blocking oscillator applying the portion of said second pulse to said delay line for developing a delayed leading edge of said portion of said second pulse, a second blocking oscillator coupled to said delay line for developing a third pulse having a leading edge with a substantially fast rise time in response to the delayed leading edge of said second pulse, control means coupled between said first and second blocking oscillators for applying the leading edge of said third pulse to said first blocking oscillator to terminate said portion of said first pulse applied to said output terminal so that said first pulse has a trailing edge with a substantially fast fall time and with a width determined by said delay line.

5. A pulse forming circuit for applying an output pulse to an output terminal comprising a source of input signals, a first blocking oscillator including an amplifier tube coupled to said source of input signals and a blocking oscillator tube and a transformer coupled together and to said amplifier tube, time delay means coupled to said blocking oscillator tube of said first blocking oscillator, a second blocking oscillator including an amplifier tube coupled to said time delay means and a blocking oscillator tube and a transformer coupled together and to said amplifier tube, a conductive element maintained at a level of reference potential, and a control tube coupled between the transformer of said second blocking oscillator, said conductive element, and the blocking oscillator tube and transformer of said first blocking oscillator for de-energizing the transformer of said first blocking oscillator at the termination of the output pulse therefrom, whereby the transformer of said first blocking oscillator forms a substantially square pulse in response to an input signal.

6. A timing circuit for responding to a trigger pulse from an input source to develop an output pulse of a predetermined width with a steep leading and a steep trailing edge comprising a first parallel triggering blocking oscillator including an amplifier tube coupled to said input source and a transformer and blocking oscillator tube coupled together and to said amplifier tube, said first blocking oscillator responding to said trigger pulse to develop a leading edge of said output pulse, a delay line circuit coupled to the blocking oscillator tube for developing a delayed leading edge, a second parallel triggering blocking oscillator including an amplifier tube coupled to said delay line circuit and a transformer and a blocking oscillator tube coupled together and to said amplifier tube, said second blocking oscillator responding to said delayed leading edge to develop the leading edge of a control pulse, a conductive element maintained at a level of reference potential, and a control tube coupled between the transformer of said second blocking oscillator, the transformer of said first blocking oscillator and said conductive element to respond to the leading edge of said control pulse to apply the reference potential to the transformer of said first blocking oscillator to rapidly develop the trailing edge of said output pulse, whereby said output pulse has a steep leading and trailing edge and a width substantially determined by the delay time of said delay line circuit.

7. A circuit responding to a source of trigger signals to develop a first pulse having fast rise and fall times comprising delay means, a first blocking oscillator coupled between said source of trigger signals and said delay means to develop a first and a second pulse with a fast rise time and apply the second pulse to said delay means to form a delayed pulse, said first blocking oscillator including a transformer, a second blocking oscillator coupled to said delay means, a conductive element maintained at a level of reference potential, and switching means being normally non conductive and coupled between said first blocking oscillator and said conductive element and to said second blocking oscillator, said second blocking oscillator responding to said delayed pulse to bias said switching means into conduction to apply the reference potential to the transformer of said first blocking oscillator and terminate said first pulse with a fast fall time.

8. A pulse generator comprising a source of trigger signals, delay means, blocking oscillator means coupled between said source of trigger signals and said delay means, said blocking oscillator means developing a first and a second pulse and applying said first pulse to said delay means to form a delayed pulse, control means coupled to said delay means to develop a control signal in response to said delayed pulse, and controllable impedance switching means coupled between said control means and said blocking oscillator means for decreasing its impedance in response to said control signal to deenergize said blocking oscillator means to terminate said second pulse with a fast fall time.

References Cited in the file of this patent

UNITED STATES PATENTS

| | | |
|---|---|---|
| 2,447,082 | Miller | Aug. 17, 1948 |
| 2,485,395 | Lord | Oct. 18, 1949 |
| 2,605,405 | Lentz | July 29, 1952 |
| 2,613,318 | Snyder et al. | Oct. 7, 1952 |
| 2,614,218 | Hancock | Oct. 14, 1952 |
| 2,636,119 | Forbes | Apr. 21, 1953 |
| 2,697,166 | MacNichol et al. | Dec. 14, 1954 |
| 2,740,109 | Okrent | Mar. 27, 1956 |
| 2,847,568 | Saucedo | Aug. 12, 1958 |